United States Patent
Huitink et al.

(10) Patent No.: US 11,935,810 B2
(45) Date of Patent: Mar. 19, 2024

(54) CHIP WARPAGE REDUCTION VIA RAISED FREE BENDING AND RE-ENTRANT (AUXETIC) TRACE GEOMETRIES

(71) Applicant: BOARD OF TRUSTEES OF THE UNIVERSITY OF ARKANSAS, Fayetteville, AR (US)

(72) Inventors: David Huitink, Prairie Grove, AR (US); John Harris, Rogers, AR (US)

(73) Assignee: Board Of Trustees Of The University Of Arkansas, Little Rock, AR (US)

(*) Notice: Subject to any disclaimer, the term of this patent is extended or adjusted under 35 U.S.C. 154(b) by 156 days.

(21) Appl. No.: 17/313,861

(22) Filed: May 6, 2021

(65) Prior Publication Data
US 2021/0265236 A1 Aug. 26, 2021

Related U.S. Application Data

(63) Continuation of application No. 16/277,934, filed on Feb. 15, 2019, now abandoned.

(60) Provisional application No. 62/631,337, filed on Feb. 15, 2018.

(51) Int. Cl.
*H01L 23/373* (2006.01)
*B32B 9/04* (2006.01)
*H01L 21/48* (2006.01)
*H01L 23/00* (2006.01)

(52) U.S. Cl.
CPC .......... *H01L 23/3735* (2013.01); *B32B 9/041* (2013.01); *H01L 21/4882* (2013.01); *H01L 23/562* (2013.01); *H01L 24/24* (2013.01); *B32B 2307/30* (2013.01); *B32B 2457/00* (2013.01); *Y10T 428/24942* (2015.01)

(58) Field of Classification Search
CPC . H10L 23/3735; B32B 9/041; B32B 2307/30; B32B 2457/00; H01L 21/4882; H01L 23/562; H01L 24/24; H01L 23/5221; H01L 24/13; H01L 24/81; H01L 23/49838; H01L 2224/13101; H01L 2224/81815; H01L 2924/10253; H01L 2924/10272; H01L 2924/1033; H01L 23/367; H01L 23/373; Y10T 428/24942
See application file for complete search history.

(56) References Cited

U.S. PATENT DOCUMENTS

2018/0061743 A1* 3/2018 Hsu .................... H05K 1/0283

FOREIGN PATENT DOCUMENTS

WO WO-2016144356 A1 * 9/2016 ......... H01L 21/4853

OTHER PUBLICATIONS

[NPL-1] "Thermal Expansion—Linear Expansion Coefficients"; The Engineering ToolBox (Mar. 3, 2023), <https://www.engineeringtoolbox.com/linear-expansion-coefficients-d_95.html>. (Year: 2023).*

[NPL-2] "Kapton® HN"; DuPont (Mar. 3, 2023), <https://www.dupont.com/content/dam/dupont/amer/us/en/products/ei-transformation/documents/DEC-Kapton-HN-datasheet.pdf>. (Year: 2023).*

* cited by examiner

*Primary Examiner* — David Sample
*Assistant Examiner* — Donald M Flores, Jr.
(74) *Attorney, Agent, or Firm* — Keith A. Vogt; Keith Vogt Ltd.

(57) ABSTRACT

A microelectronic device and method of making the same including a substrate and at least one expansion layer that adds stress to the substrate when said substrate expands.

8 Claims, 11 Drawing Sheets

CHIP WARPAGE REDUCTION VIA RAISED FREE BENDING AND RE-ENTRANT (AUXETIC) TRACE GEOMETRIES

RELATED APPLICATIONS

This application is a continuation of U.S. Ser. No. 16/277,934 filed on Feb. 15, 2019, which claims priority to U.S. Provisional Application No. 62/631,337 filed on Feb. 15, 2018, both of which are hereby incorporated in their entirety

STATEMENT REGARDING FEDERALLY SPONSORED RESEARCH & DEVELOPMENT

This invention was made with government support by the National Science Foundation No. EEC1449548. The government has certain rights in the invention.

INCORPORATION BY REFERENCE OF MATERIAL SUBMITTED ON A COMPACT DISC

Not applicable.

BACKGROUND OF THE INVENTION

A key challenge in microelectronic assembly arises when chip warpage, resulting from thermal expansion mismatch in layered materials, drives incompatibility in assembly and can result in interfacial stresses when experiencing temperature swings native to device operation. In design of electronic routing layers in Si chips and theft associated packaging, linear copper structures are traditionally used to deliver current and signals to and from the active elements in the device. The layout and direction of these traces are directly related to the warpage that is demonstrated in microelectronic devices, and often must be balanced in the design in an attempt to homogenize the warpage such that it behaves within the constraints of assembly.

In fact, warpage is one of the key deterrents to further scaling devices, particularly in the chip to package interconnect region. Recently, in other fields, auxetic structures have been touted for their negative poison's ratio, where a material compresses in the lateral direction it is also compressed along its length, unlike most materials which have opposite effects. Usually, this is accomplished through a structural technique which uses "re-entrant" lattices, which translate compression/tension into bending moments, for which deflection of the structure is enabled through displacement of lattice sites within the framework. Most work with these structures has been in three dimensions in areas such as impact absorption and adaptive structures.

BRIEF SUMMARY OF THE INVENTION

In one embodiment, the present invention applies uses auxetic behavior and load translation techniques using bending moments to layered or two-dimensional materials, and processes to relieve the stress created in structures such as microchips by differentials in the materials' coefficients of thermal expansion.

In other embodiments of the present invention, interfacial stresses can be translated within the auxetic structure and thereby reduce warpage and allow for tighter packing of electronics, thinner chips, longer fatigue life, and reduced design compensation factors.

In other embodiments, the present invention presents a design methodology of using re-entrant or bent trace shapes within a layered electronic device to dramatically reduce warpage effects caused by the thermal expansion differences in electronic materials. By raising traces of nonlinear geometries off the substrate they are free to bend and compress and reduce interfacial stresses: and subsequently reducing warpage in the patterned device.

In other embodiments, the present invention may produce a reduction in warpages. In a preferred embodiment, a 50.78% reduction in warpage in a Si device patterned with a re-entrant design was obtained as compared to a similarly routed design using linear features.

In other embodiments of the present invention, designs having a negative Poisson's ratio or auxetic structure may be used to improve the reliability of electronic devices by relieving thermo-mechanical stresses induced by environment and working conditions.

In other embodiments of the present invention, 2-D auxetic structures may be implemented on PCB and DBC substrates during the fabrication process.

In other embodiments of the present invention, the designs can be created with traditional photolithography techniques and plating and can be used for normal power, ground, and signal routing in electronic devices. The improvements can lead to enhanced assembly yield of electronic devices, particularly in very large or very thin devices in flip chip packages. Moreover, for similarly sized devices, the reduction of warpage can also lead to better reliability in interconnects, as less stress is transferred into solder joints or epoxy layers meant to maintain structural integrity as the device traverses stress states coming from temperature swings and gradients during operation.

In other embodiments, the present invention provides a layered production method for microchips allowing for increased trace freedom, relieving pressure due to thermal expansion. The resulting reduction in chip area warpage allows for thinner chips and smaller compensation factors which could lead to more efficient use of space in electronics or alternatively higher yield in large devices. Additionally, the reduction in warpage impacts interfacial stresses in such a way that extended lifetimes are made possible through the reduction in thermomechanical fatigue.

In yet other embodiments, the benefits and advantages of the present invention are not isolated to only "free-bending" traces, but also in cases where they may be encapsulated by a "soft" dielectric material, that is compliant.

In yet other embodiments, the benefits and advantages of the present invention may be used with silicon RDL structures such as at the backend were thick metal re-distribution layer (RDL) may be found. Using re-entrant features (auxetic structures) to achieve interfacial stress reductions in final layers of interconnect routing will reduce warpage induced in stackup during temperature changes. The embodiments of the present invention will also reduce stress in chip-package interconnects. The raised features of the present invention create vias and air gaps that amplify the benefits of the present invention.

In yet other embodiments, the benefits and advantages of the present invention may be used with substrate level traces and Cu planes at locations such as at the substrate copper layers. The embodiments of the present invention replace Cu planes in PCB (organic) of DBC/DBA (ceramic) with auxetic style etched Cu, for reducing interfacial stresses that can drive warpage and risk of copper delamination. The embodiments of the present invention may also replace ground and power planes in Organic PCBs or Cu laminated layers on DBC substrates. The embodiments of the present invention reduce warpage induced in stackup during temperature changes (especially PCBs). The embodiments of the present invention will also reduce stress in Cu-Alumina interface, reducing the risk of Cu delamination and extending lifetime. The raised features of the present invention improve thermal conduction in substrate layers, as compared to removing copper, but much less stress than a full-area copper plane.

In another embodiment, the present invention concerns a microelectronic device comprising: a substrate; at least one expansion layer connected to the substrate; and wherein the at least one expansion layer adds stress to the substrate when the substrate expands.

In another embodiment, the present invention concerns a microelectronic device with at least one expansion layer. The layer may be at least one pattern comprised of a curved shape, auxetic shape, or a closed curved shape or combinations of these shapes.

In another embodiment, the present invention concerns a microelectronic device wherein the at least one expansion layer has a coefficient of expansion greater than the substrate.

In another embodiment, the present invention concerns a microelectronic device a microelectronic device comprising: a substrate, at least one expansion layer located a spaced distance above and apart from the substrate; one or more connectors located between the substrate and the at least one expansion layer, the one or more connectors connected to the substrate and the at least one expansion layer; wherein the at least one expansion layer adds stress to the substrate when the substrate expands.

In another embodiment, the present invention concerns a microelectronic device wherein when the substrate expands the at least one expansion layer has a greater expansion such that the expansion of the expansion layer is mitigated within the expansion layer, rather than at the interface of the substrate.

In another embodiment, the present invention concerns a method of reducing the warpage of a substrate in a microelectronic comprising the steps of: forming at least one expansion layer on the substrate wherein the at least one expansion layer adds stress to the substrate when the substrate expands.

In another embodiment, the present invention concerns a method of reducing the warpage of a substrate in a microelectronic comprising the steps of: forming a layer comprised of one or more connectors on the substrate; forming at least one expansion layer on the connector layer to locate the at least one expansion layer a spaced distance above and apart from the substrate; wherein the at least one expansion layer adds stress to the substrate when the substrate expands.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

In the drawings, which are not necessarily drawn to scale, like numerals may describe substantially similar components throughout the several views. Like numerals having different letter suffixes may represent different instances of substantially similar components. The drawings illustrate generally, by way of example, but not by way of limitation, a detailed description of certain embodiments discussed in the present document.

DETAILED DESCRIPTION OF THE INVENTION

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a representative basis for teaching one skilled in the art to variously employ the present invention in virtually any appropriately detailed method, structure or system. Further, the terms and phrases used herein are not intended to be limiting, but rather to provide an understandable description of the invention.

Most electronic devices are made of multiple materials stacked in layered form, where usually copper and silicon dominate the material composition along with some dielectric insulating layers. Cu and Si have very different thermal expansions when heated, which leads to interfacial stresses where they are bonded together. These stresses are either accommodated through the combined material stack bending under the intrinsic load of the composite material, or failure of the bond between Cu and Si (and other materials). In a complex device, there are multiple layers of Cu traces that are stacked on top of each other, creating a Cu metal "lattice" above the Si substrate where the active circuit elements exist. This lattice serves as signal spreading and power/ground planes and is intrinsic to the ability to scale integrated circuits to tiny <10 nm transistor elements.

Typically, these are patterned in a linear "Manhattan layout" style, which provides the thermal strain to induce the warpage in the final chip design. The magnitude of the resulting warpage is dependent on the "lattice density" of Cu attached above the Si, and the thickness of the silicon die/chip for being able to accommodate the interfacial stresses created by the mismatched thermal expansion (according to principles of beam theory). The magnitude of warpage then becomes when the warpage exceeds the degree of compensation allowed by solder collapse during a solder reflow process. This becomes increasingly important when Si dies become very large in lateral dimension, or when the dies become very thin, as well as when solder interconnects become smaller and closer together to accommodate scaling of higher density interconnect devices.

In one embodiment, the present invention modifies the design of a structure to reduce warpage, temperature and stresses using auxetic, curved geometries ad closed curved geometries. Auxetic structures are shapes having a negative Poisson's ratio. When stretched, auxetic structures become thicker perpendicular to the applied force which often is the expansion of the substrate.

Figure 1A:
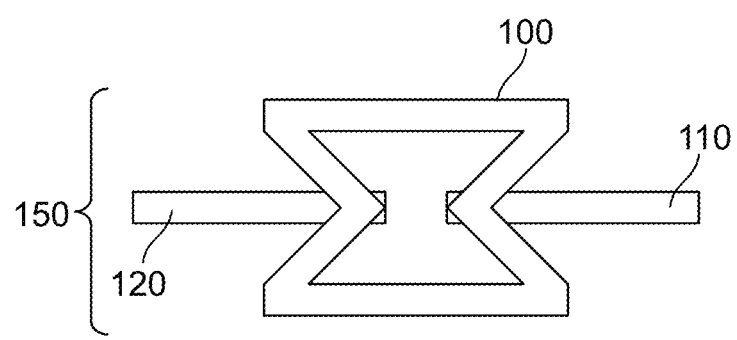
FIG. 1A is a top view of a raised unit pattern using a shape commonly referred to as a raised Evans or hourglass shape and connecting segments used with an embodiment of the present invention.
Figure 1B:
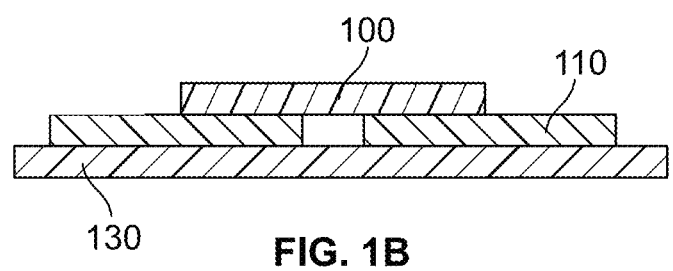
FIG. 1B is a side view of the raised unit pattern shown in FIG. 1A.
Figure 1C:
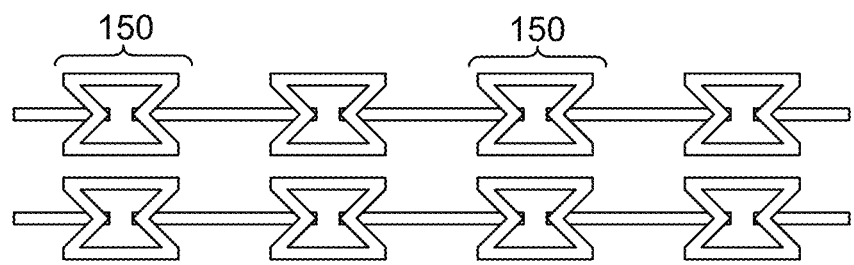
FIG. 1C is a top view showing how the pattern shown in FIG. 1A may be made into a repeating pattern.

As shown in FIGS. 1A-1C, in one embodiment of the present invention, an auxetic raised unit pattern using shape 100 commonly referred to as an Evans or hourglass shape and connecting segments 110 and 120 may be used with an embodiment of the present invention. As shown in FIGS. 1A and 1C, shape 100 and connecting segments 110 and 120 form a repeating pattern 150.

As shown, shape 100 may be a second layer located on top of connectors 110 and 120. By raising traces of nonlinear geometries such as shapes 100 off substrate 130 by locating them on connectors 110 and 120 which are located on substrate 130, they are free to bend and compress and reduce interfacial stresses: and subsequently reducing warpage in the patterned device.

Alternately, the shapes may be located on the substrate and the connectors may be spaced apart from the substrate by being placed on the shape. Also, the shapes and connectors may be a single layer. In addition, multiple layers of the shapes and connectors may be used.

Figure 2A:
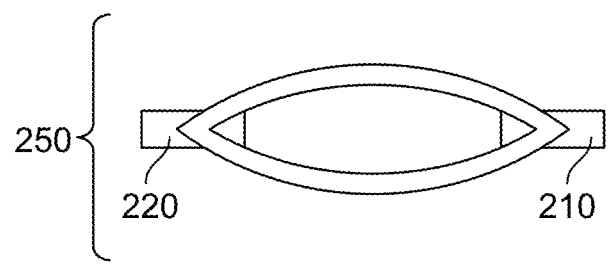
FIG. 2A is a top view of a raised unit pattern using a shape commonly referred to as a raised elliptical shape including connecting segments used with an embodiment of the present invention.
Figure 2B:
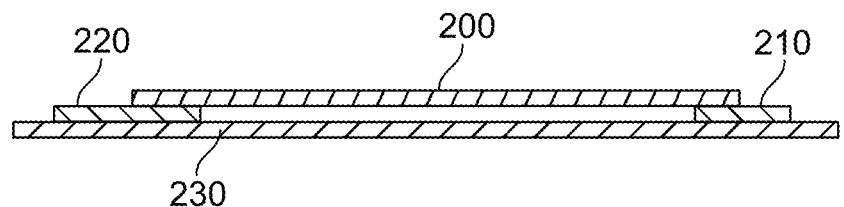
FIG. 2B is a side view of the raised unit pattern shown in FIG. 2A.
Figure 2C:
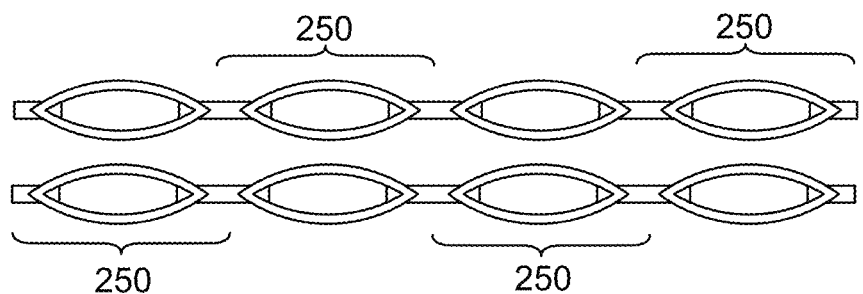
FIG. 2C is a top view showing how the pattern shown in FIG. 2A may be made into a repeating pattern.

As shown in FIGS. 2A-1C, in one embodiment of the present invention, an auxetic raised unit pattern using shape 200 which is elliptical (closed curved geometry) as well as connecting segments 210 and 220 may be used with an embodiment of the present invention. As shown in FIGS. 2A and 2C, shape 200 and connecting segments 210 and 220 form a repeating pattern 250.

As shown, shape 200 may be a second layer located on top of connectors 210 and 220. By raising traces of nonlinear geometries such as shapes 200 off substrate 230 by locating them on connectors 210 and 220 which are located on substrate 130, they are free to bend and compress and reduce interfacial stresses: and subsequently reducing warpage in the patterned device.

Alternately, the shapes may be located on the substrate and the connectors may be spaced apart from the substrate by being placed on the shape. Also, the shapes and connectors may be a single layer. In addition, multiple layers of the shapes and connectors may be used.

Figure 3:
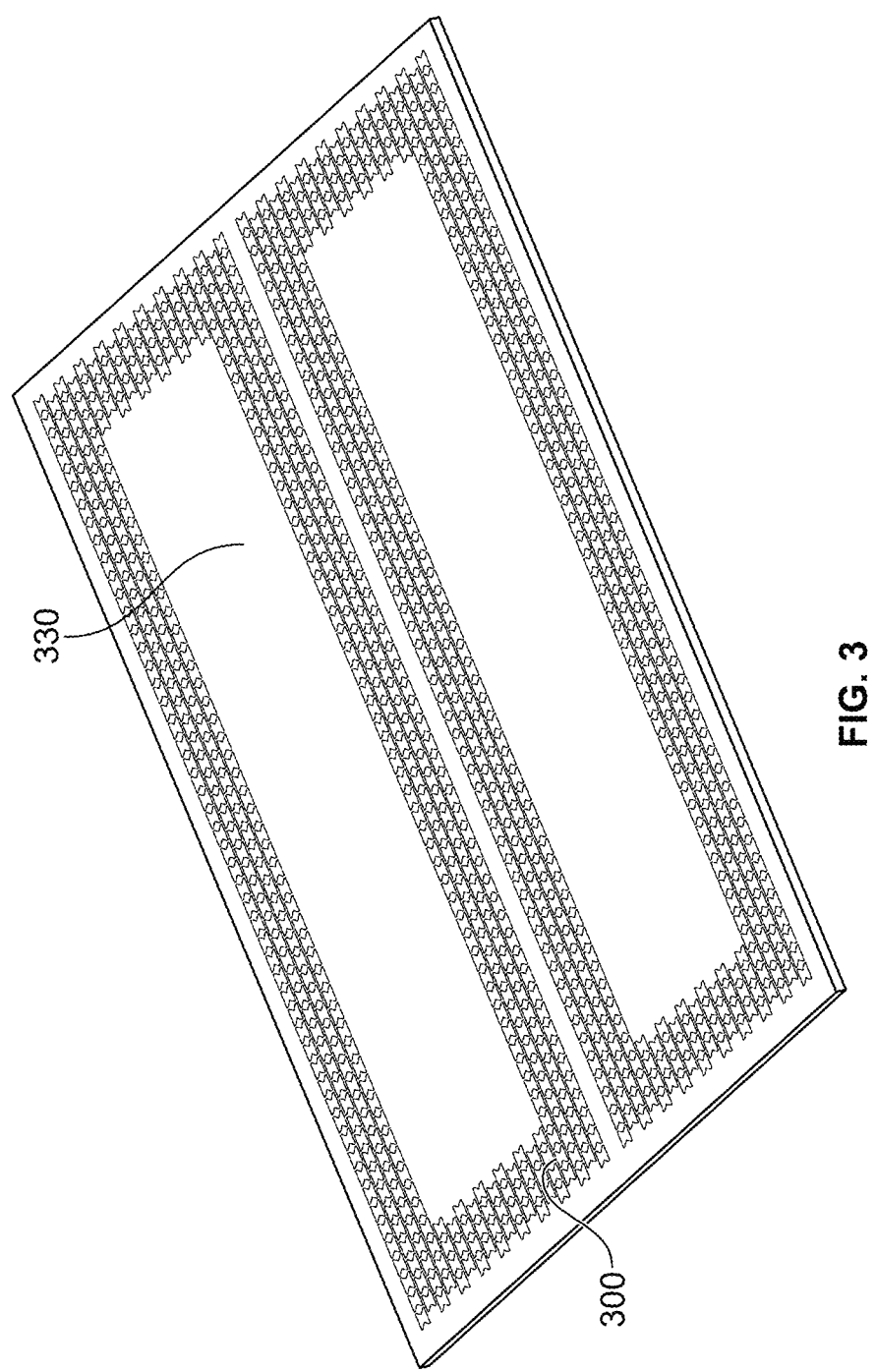
FIG. 3 shows the repeating pattern shown in FIG. 1A applied to a microelectronics substrate for an embodiment of the present invention.

FIG. 3 shows pattern 300 applied to a microelectronic substrate 330 for an embodiment of the present invention. Pattern 300 may be the patterns 150 or 250 as well as any other pattern or combination of patterns that have curved shapes, closed curved or have a negative Poisson's ratio. As to the location and/or amount of coverage of the patterns or connectors on the substrate, persons of ordinary skill in the art would recognize that this may vary from application to application and may be optimized depending on the intended application. Thus, the partial coverage shown in FIG. 3 is exemplary only.

Figure 4A:
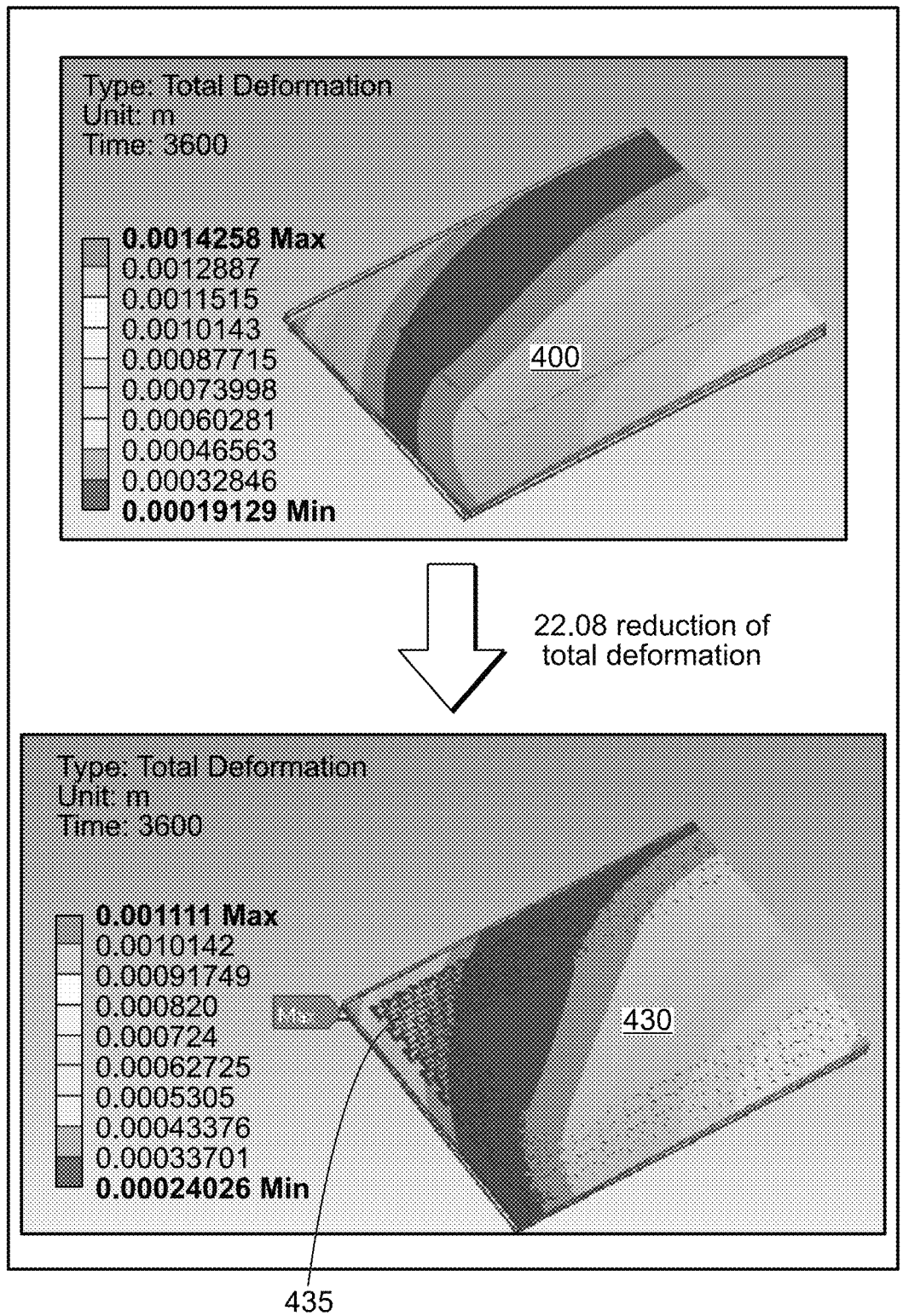
FIGS. 4A & 4B illustrate the effects of an auxetic structure pattern on a DBC substrate for an embodiment of the present invention.
Figure 4B:
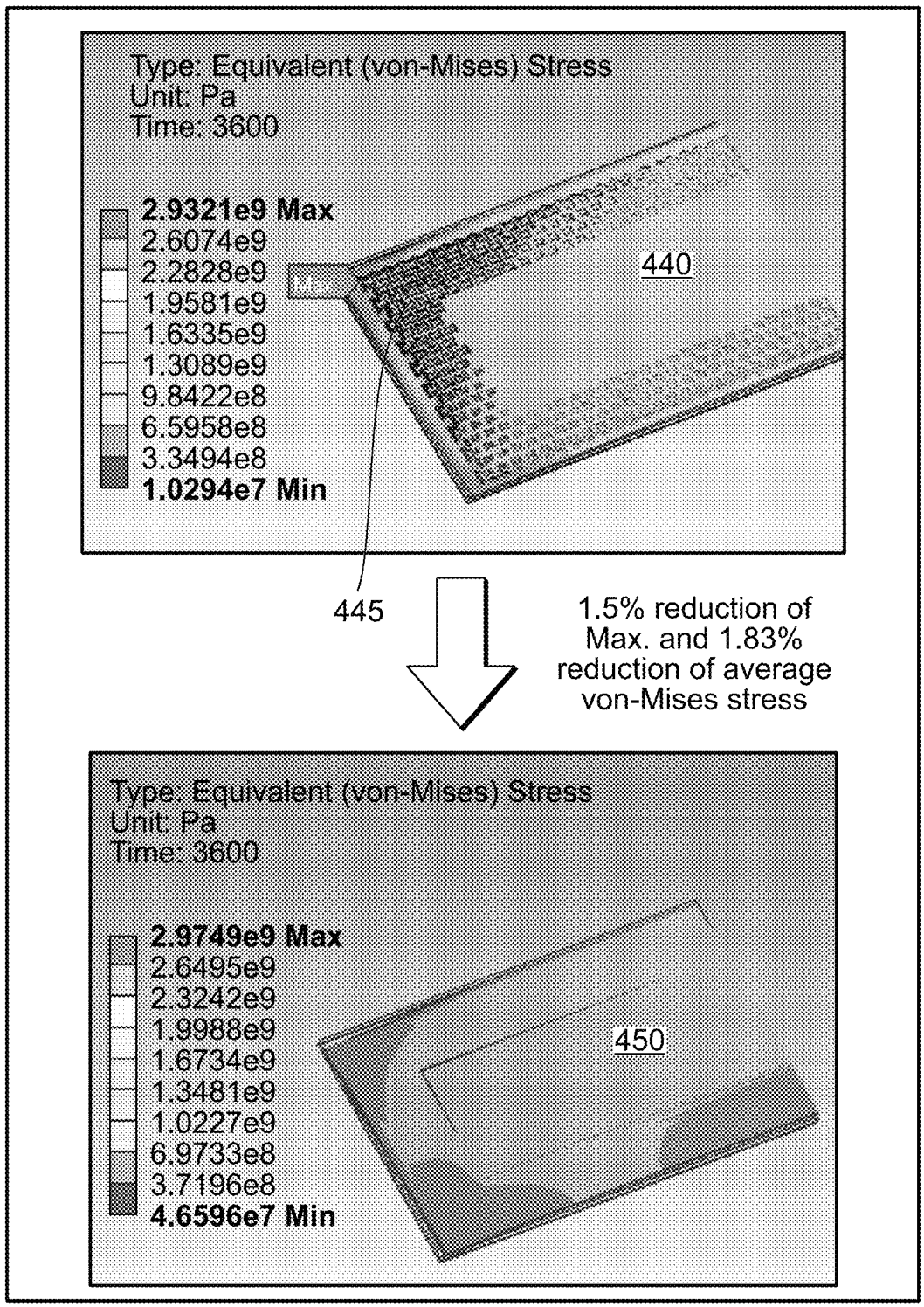

FIG. 4 illustrates the effects of an auxetic structure pattern on a DBC substrate for an embodiment of the present invention. As shown, applying pattern 435 to substrate 430 resulted in a 22.08% reduction in total deformation as compared to unpatterned DBC substrate 400. As also shown, applying pattern 445 to substrate 440 resulted in a 1.5% reduction of maximum and 1.83% reduction of average von-Mises stress as compared to unpatterned DBC substrate 450.

Figure 5:
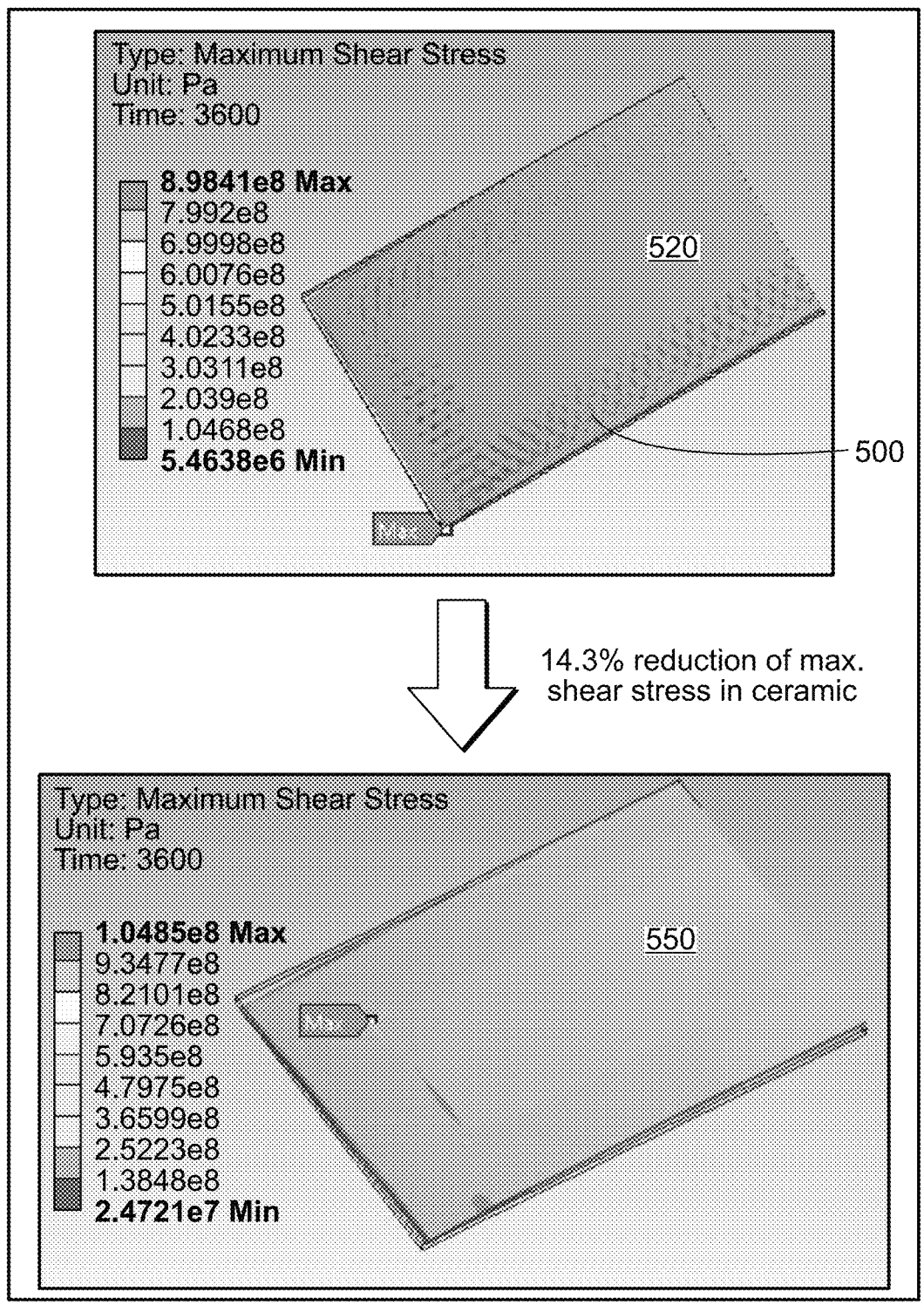
FIG. 5 illustrates the effects of an auxetic structure pattern on a DBC substrate for an embodiment of the present invention.

FIG. 5 illustrates the effects of an auxetic structure pattern on a DBC substrate for an embodiment of the present invention. As shown, applying pattern 500 to substrate 520 resulted in a 14.3% reduction of maximum shear stress in the ceramic as compare to unpatterned DBC substrate 550.

Figure 6:
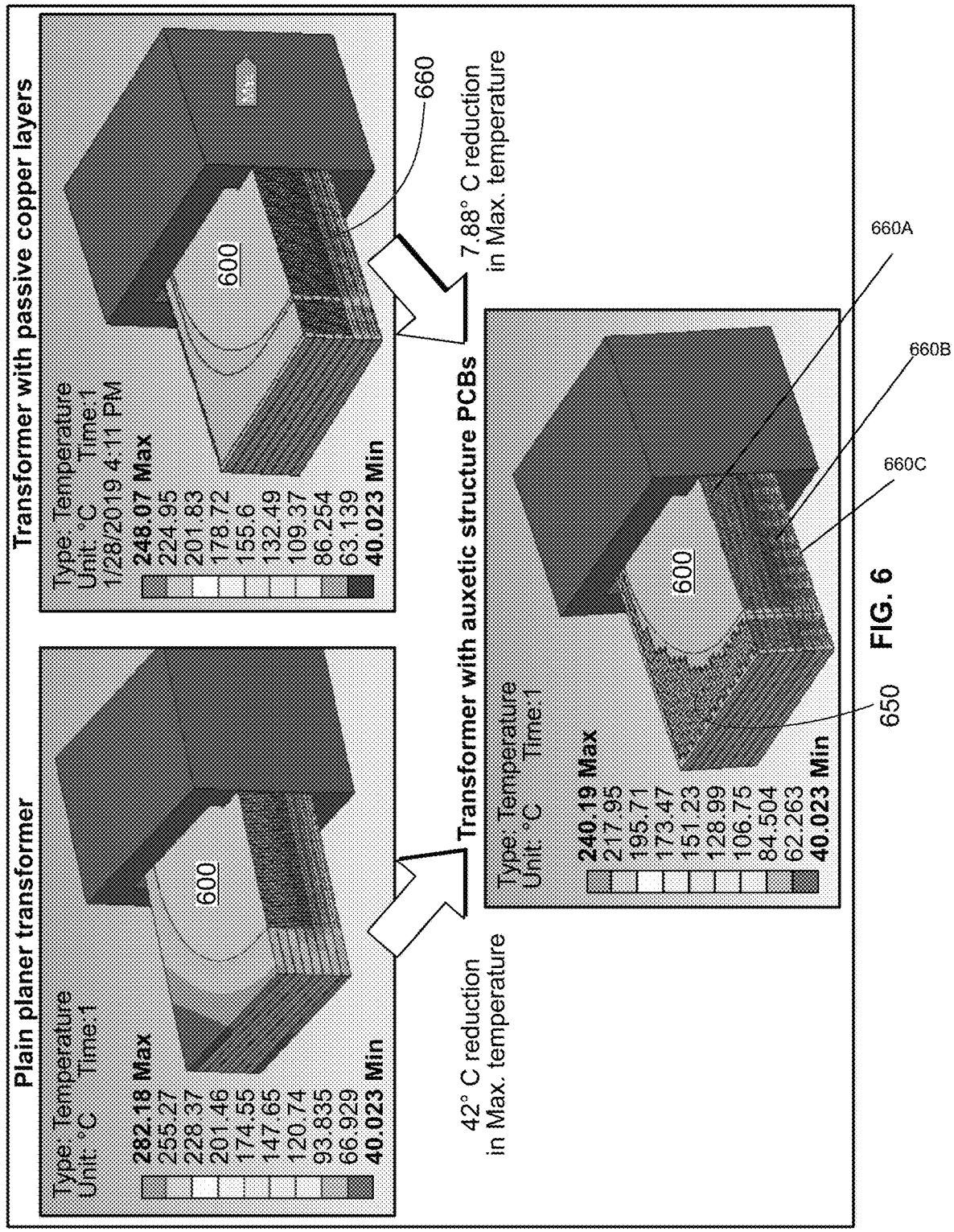
FIG. 6 illustrates the effects of an auxetic structure pattern on a planer transformer with respect to temperature distribution for an embodiment of the present invention.

FIG. 6 illustrates the effects of an auxetic structure pattern on a planer transformer with respect to temperature distribution for an embodiment of the present invention. As shown, planer transformer 600, with no pattern applied, had a 42° C. reduction in maximum temperature as a result of applying pattern 650 to substrate 600. As is also shown, even when substrate 600 includes a plurality of passive copper layers 660A-660C, applying pattern 650 to the layers of substrate 600 results in a 7.88° C. reduction in maximum temperature.

FIG. 6 illustrates the effects of an auxetic structure pattern on a planer transformer with respect to temperature distribution for an embodiment of the present invention.

Figure 7:
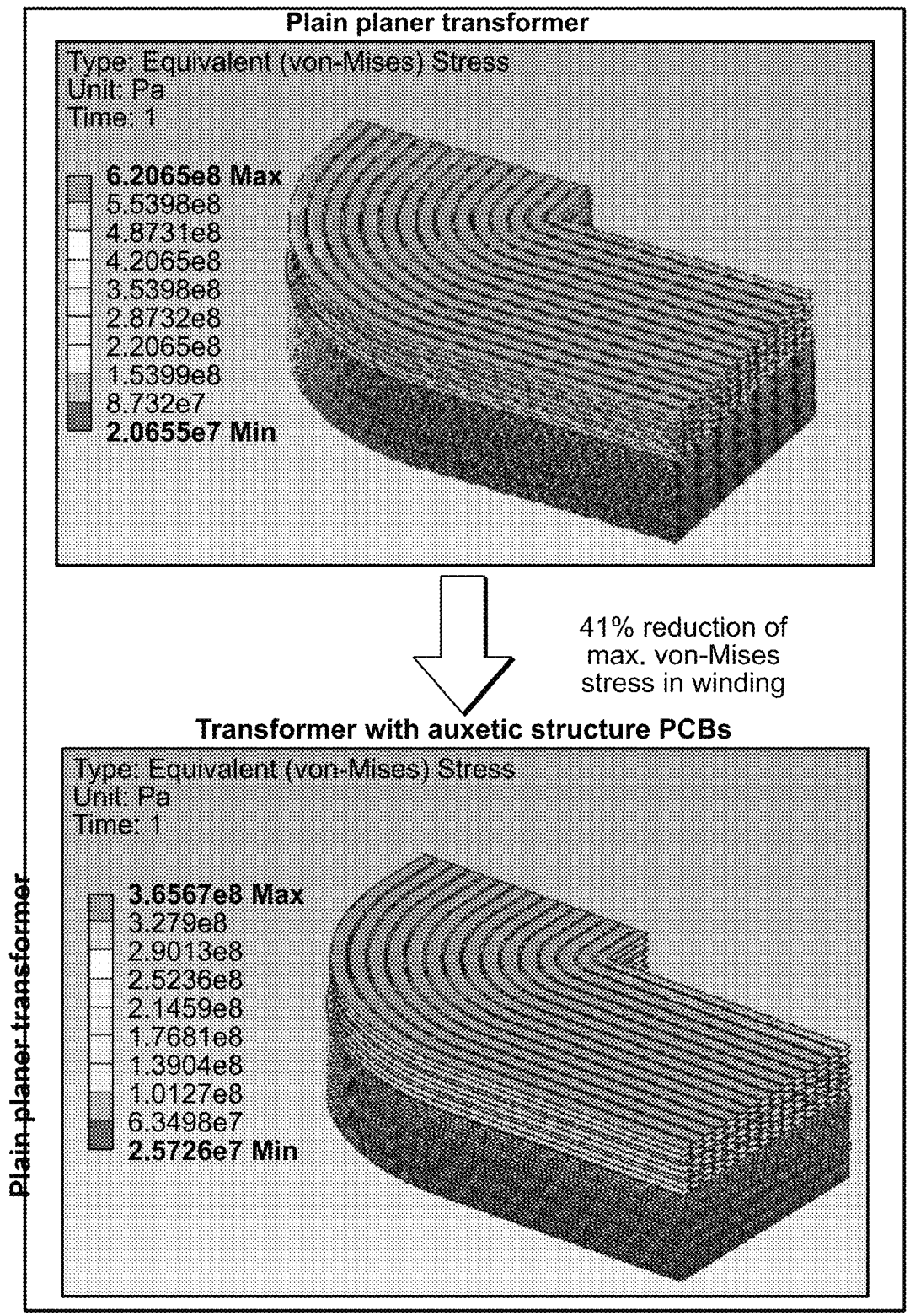
FIG. 7 illustrates the effects of an auxetic structure pattern on a planer transformer with respect to Von-Mises stressing the windings of a transformer for an embodiment of the present invention.

FIG. 7 illustrates the effects of an auxetic structure pattern on a planer transformer with respect to Von-Mises stressing the windings of a transformer for an embodiment of the present invention.

Figure 8:
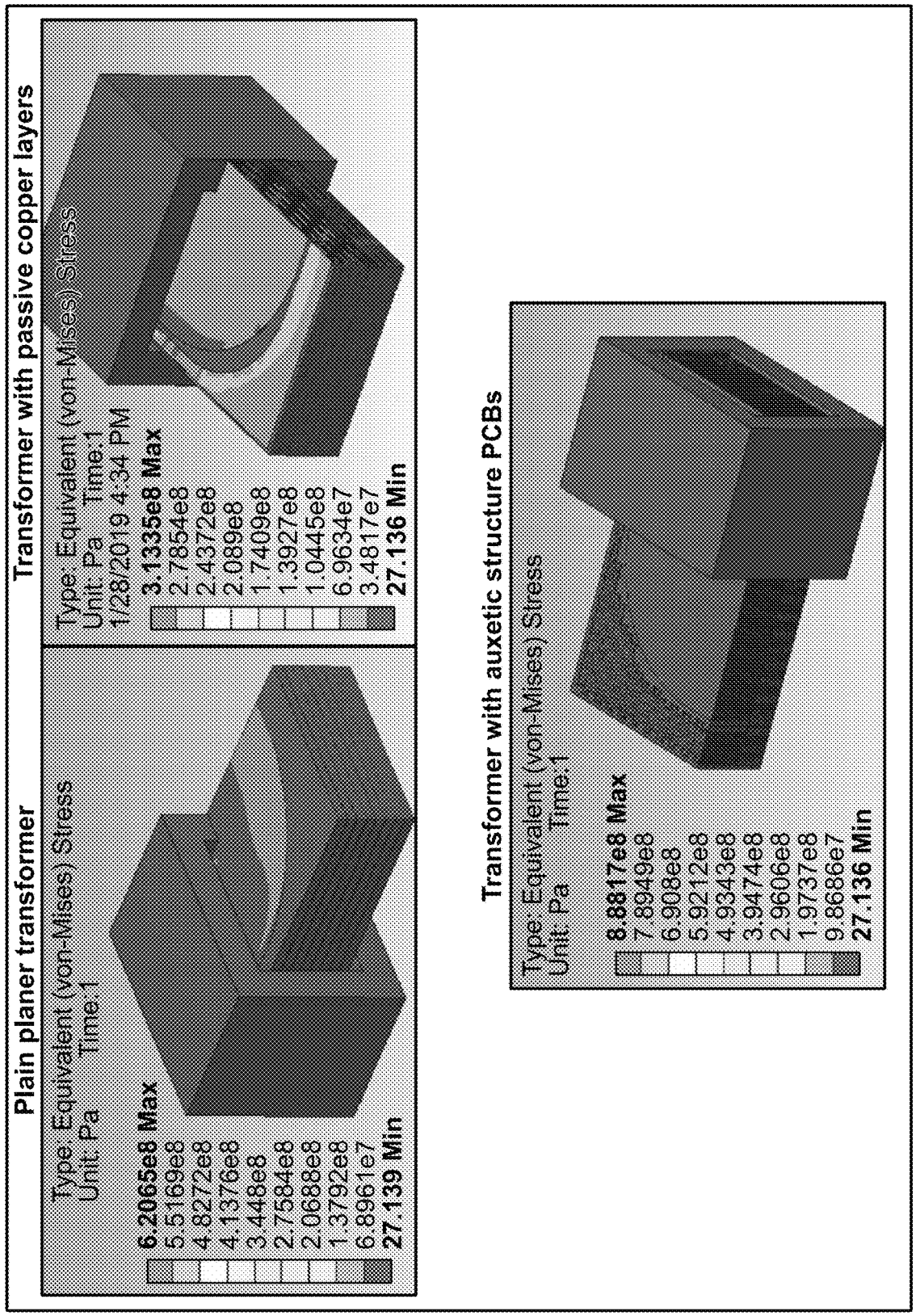
FIG. 8 illustrates the effects of an auxetic structure pattern on a planer transformer with respect to stress distribution for an embodiment of the present invention.

FIG. 8 illustrates the effects of an auxetic structure pattern on a planer transformer with respect to stress distribution for an embodiment of the present invention.

Figure 9:
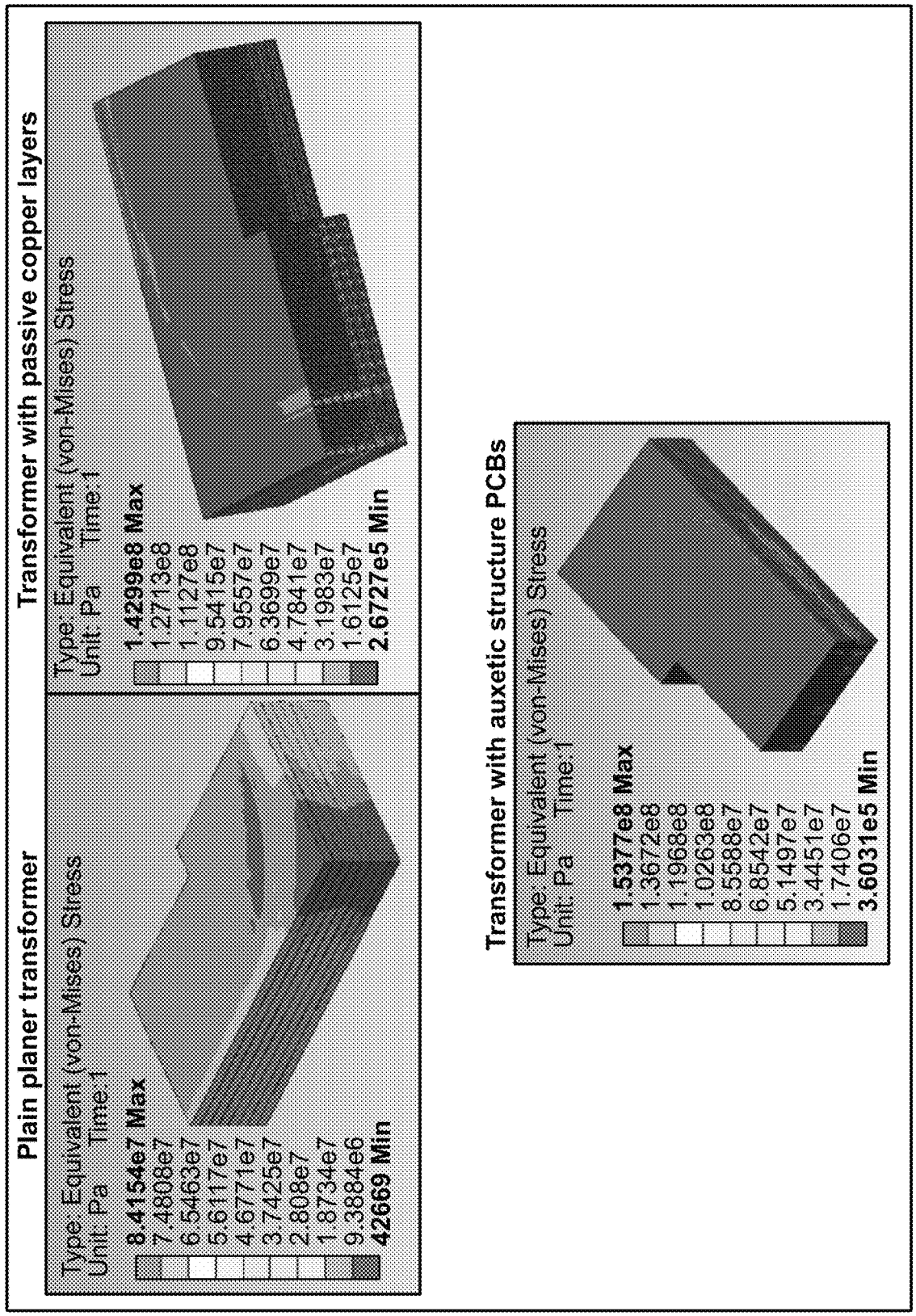
FIG. 9 illustrates the effects of an auxetic structure pattern on FR-4 layers with respect to stress distribution for an embodiment of the present invention.

FIG. 9 illustrates the effects of an auxetic structure pattern on FR-4 layers with respect to stress distribution for an embodiment of the present invention.

Figure 10:
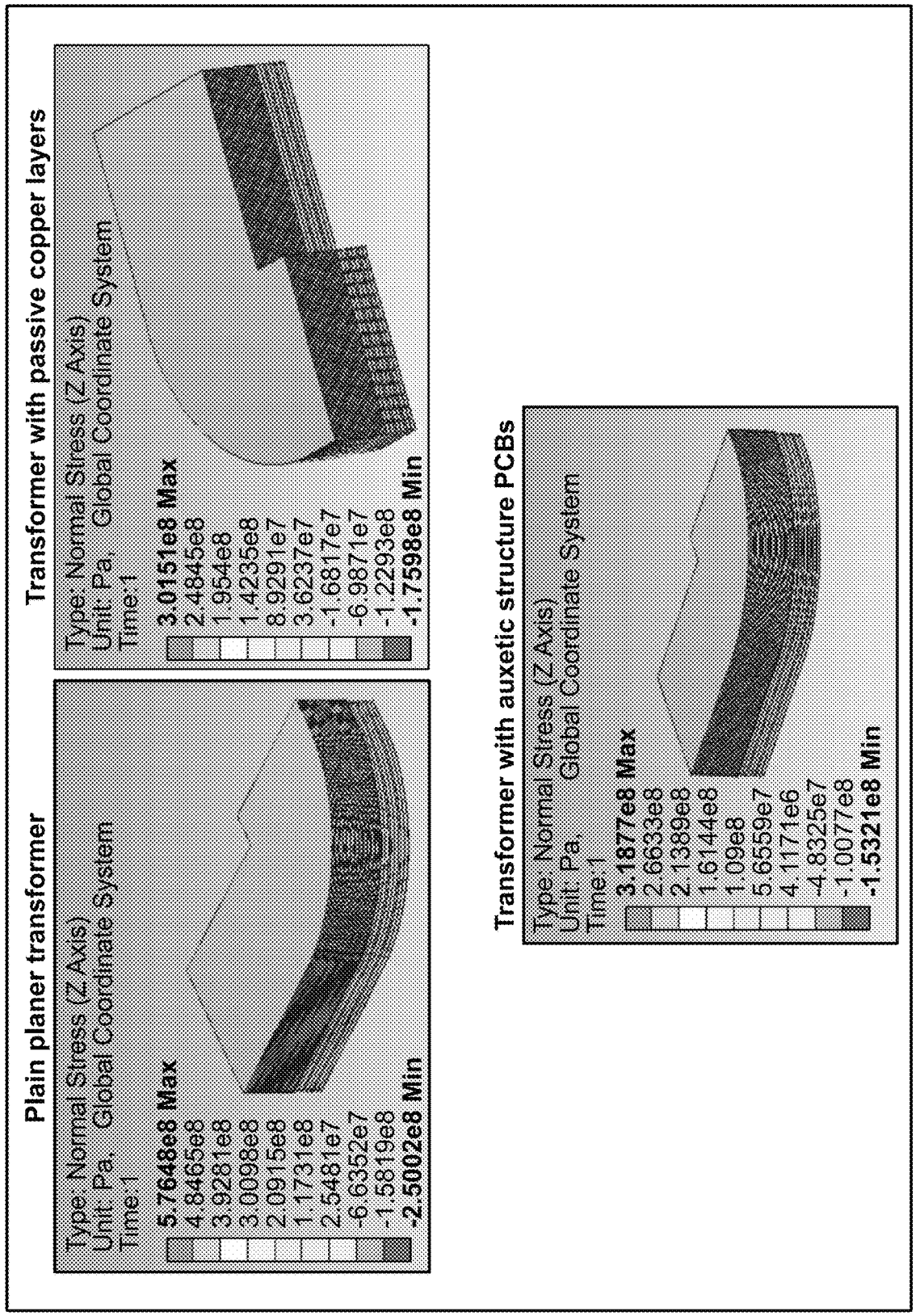
FIG. 10 illustrates the effects of an auxetic structure pattern on the windings of a transformer with respect to peeling stress for an embodiment of the present invention.

FIG. 10 illustrates the effects of an auxetic structure pattern on the windings of a transformer with respect to peeling stress for an embodiment of the present invention.

In another preferred embodiment of the present invention, the design of a Cu trace lattice, or other materials, lattices or layers, can be modified and enhanced to reduce the effective thermal expansion in the Cu lattice structure and thereby reduce interfacial stresses, leading to reduced warpage. By suspending a nonlinear or auxetic shape (as opposed to typical linear structures) above the substrate, it can move and bend unobstructed, so the stress created by the greater expansion of copper, which has a coefficient of expansion greater than the substrate, is mitigated within the lattice, rather than at the interface to the substrate.

In yet another preferred embodiment of the present invention, the design of a Cu trace lattice, or other materials, lattices or layers, can be modified using auxetic and curved trace geometries used in planar lithographically patterned layered material, such as interconnects and traces in electronic devices, for warpage and interfacial stress reduction in these layered materials as described above. By using alternative design features of the Cu traces, the associated warpage can be reduced.

This may be accomplished by using Si and Cu as the two primary material systems present in consumer electronic devices, but can be extended to many other materials and systems, including organically laminated motherboards, interposers and even alternative high-bandwidth semi-conductors like SiC and GaN. By adding into the design trace features that can accommodate some flexure, the stresses and warpage can be reduced, enabling electronic devices to become thinner, more compact, while also being able to improve fatigue reliability of critical interfaces and thereby extend life.

Various trace geometries where molded on 5 mm square, 0.1 mm thick chips and subjected to temperatures of 100 deg. C. with rest ("stress-free temperature") being 22 deg. C. By raising the nonlinear copper geometries above the silicon and only having larger amounts of material suspended above the substrate than the small amounts in contact, the embodiments of the present invention were able to achieve warp reductions of over 50% compared to chips with linear traces having the same amount of coverage. If the exact coverage could not be matched the closest value below the test chip's coverage was used to ensure viable results. Three raised geometries were tested: the Evans (hourglass) auxetic shape 150, linear, and an elliptical shape 250.

| Name | Copper Coverage | Peak to Valley Warp (m) | Percent Warp Reduction |
| --- | --- | --- | --- |
| Control 12 | 12.4% | 1.51921E−06 | — |
| Raised Control 12 | 12.5% | 1.69343E−06 | — |
| Raised Eye 4 | 12.7% | 1.20059E−06 | C) 20.97% RC) 29.10% |
| Control 16 | 16% | 1.93384E−06 | — |
| Raised Evans 3 | 16.81% | 9.51830E−07 | 50.78% |

The values in the coverage column were calculated by taking the sum of the areas of the top surface on each layer in mm and dividing by 25 mm$^2$. The peak to valley distance was the maximum minus the minimum value generated by ANSYS for deformation in the y-direction or vertical direction. Percent reduction in this table is equivalent to the negative change in peak to valley warp over the control peak to valley warp.

Raising linear geometries was proven to be counterproductive. This is because, without the bond with the silicon to prevent it the copper trace expands more than if that trace is linear, the resulting expansion adds stress rather than alleviating it. By making the trace non-linear, the expansion can be accommodated through bending.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above-described embodiments, methods, and examples, but by all embodiments and methods within the scope and spirit of the disclosure.

What is claimed is:

1. A transformer comprising:
a transformer having a plurality of passive copper layers;
each of said copper layers having a perimeter;
each of said copper layers including an expansion layer thereon; and
wherein when each of said passive copper layers expand, said expansion layers become thicker perpendicular to a direction of expansion.

2. The transformer of claim 1 wherein said expansion layers include at least one pattern comprised of an auxetic shape.

3. The transformer of claim 1 wherein said expansion layers include a pattern of auxetic shapes on said perimeter of said passive copper layers.

4. The transformer of claim 1 wherein said expansion layers include a pattern of auxetic shapes on said perimeter of said passive copper layers, said pattern of auxetic shapes surround areas having no patterns of auxetic shapes.

5. A method of reducing the warpage of passive copper layers having a perimeter in a transformer comprising the steps of: forming an expansion layer on said passive copper layers wherein when said passive copper layers expand said expansion layers become thicker perpendicular to a direction of expansion.

6. The method of claim 5 wherein said expansion layers include at least one pattern comprised of an auxetic shape.

7. The method of claim 5 wherein said expansion layers include a pattern of auxetic shapes on the perimeter of said passive copper layers.

8. The method of claim 5 wherein said expansion layers include a pattern of auxetic shapes on the perimeter of said passive copper layers, said pattern of auxetic shapes surround areas having no patterns of auxetic shapes.

* * * * *